United States Patent [19]

Takeda

[11] Patent Number: 4,477,740

[45] Date of Patent: Oct. 16, 1984

[54] EMITTER-COUPLED LOGIC CIRCUIT DEVICE

[75] Inventor: Hirofumi Takeda, Yokohama, Japan

[73] Assignee: Fujitsu Limited, Kawasaki, Japan

[21] Appl. No.: 363,858

[22] Filed: Mar. 31, 1982

[30] Foreign Application Priority Data

Mar. 31, 1981 [JP] Japan .................................. 56-48616

[51] Int. Cl.³ ................. H03K 19/086; H03K 19/092; H03K 19/20
[52] U.S. Cl. .................................... 307/455; 307/443; 307/475; 307/296 R
[58] Field of Search ............... 307/445, 446, 454, 455, 307/466, 467, 494, 355, 357, 358, 360, 264, 270, 296 R, 297, 475, 362, 299 A, 317 A, 443

[56] References Cited

U.S. PATENT DOCUMENTS

| | | | |
|---|---|---|---|
| 3,836,789 | 9/1974 | Struk et al. | 307/299 A X |
| 4,356,409 | 10/1982 | Masuda et al. | 307/455 X |
| 4,366,397 | 12/1982 | Kitamura et al. | 307/446 X |
| 4,410,816 | 10/1983 | Kanai | 307/455 |

OTHER PUBLICATIONS

Itou et al., "ECL LSI Circuit Design", Review of the Electrical Communication Laboratories, vol. 26, No. 9–10, pp. 1339–1354, Sep.–Oct. 1978.

*Primary Examiner*—Larry N. Anagnos
*Assistant Examiner*—David R. Bertelson
*Attorney, Agent, or Firm*—Staas & Halsey

[57] ABSTRACT

An emitter-coupled logic circuit device comprises first and second voltage supply lines connected, respectively, to ground and an external voltage source, a third voltage supply line, having a potential between that of the first and second voltage supply lines, an output buffer circuit connected between the first and third voltage supply lines, and an inner gate circuit connected between the third and second voltage supply lines. The current flowing through the output buffer circuit also flows through said inner gate circuit.

6 Claims, 5 Drawing Figures

EMITTER-COUPLED LOGIC CIRCUIT DEVICE

BACKGROUND OF THE INVENTION

The present invention relates to an emitter-coupled logic circuit device, and especially to an emitter-coupled logic circuit device with low power consumption.

When high-speed signal processing is required, an emitter-coupled logic (ECL) circuit device is generally used.

When an ECL device is formed as a large-scaled integrated circuit (LSI), it is often required that its external characteristics, for example, input and output level and the voltage source level, be made equivalent to those of a commercial ECL IC (e.g., ECL 10 K series by Motorola corp.).

A prior art ECL LSI is illustrated in FIG. 1. The ECL LSI of FIG. 1 comprises an input buffer circuit 1', inner logic gate circuits 21' ... 2n', and an output buffer circuit 3'. The power consumption of the ECL LSI of FIG. 1, however, is increased for the following reasons:

1. Even though the inner circuits of the ECL LSI can be operated by a low voltage source (e.g., −2.0 V), the ECL LSI must be driven by a high voltage source, for example −5.2 V or −4.5 V, in order to match with the commercial ECL IC.

2. Since each output of the ECL is connected through a load resistance of 50 Ω to a voltage source of −2.0 V, a current of about 23 mA flows out from one output terminal when it is at the "H" level (standardly −0.85 V). In order to maintain the "H" level of the output terminal above the prescribed voltage even when the above-mentioned current flows, it is necessary to make the ouput impedance of the ECL circuit sufficiently low. Thus, the main current path of the output buffer circuit which forms the output portion of the device cannot use elements having an impedance higher than a certain value. Accordingly, the current flowing inside of the output buffer circuit cannot decrease below a predetermined value regardless of the LSI manufacture technology or the target value of the switching speed.

The above factors have tended to result in a larger power consumption of ECL LSI's. However the power consumption allowed for one LSI chip is limited by the cooling ability of the chip arrangement. Therefore, there has been a tendency of having to reduce the integration scale of ECL LSI's to keep down the increase in power consumption.

SUMMARY OF THE INVENTION

It is an object of the present invention to solve the above-mentioned problems of the prior art ECL LSI's by providing an ECL circuit device in which a constant voltage between ground and a voltage source is generated. The output buffer circuit is driven by the differential voltage between ground and the constant voltage, and the inner logic circuit for performing the signal processing is driven by the remaining differential voltage between the constant voltage and the voltage source, thereby decreasing the overall power consumption of the ECL circuit device.

In accordance with the present invention, there is provided an emitter-coupled logic circuit device comprising first and second voltage supply lines connected, respectively, to ground and an external voltage source. A third voltage supply line is connected to an output terminal of a voltage regulator inserted between the first and second voltage supply lines to provide the third voltage supply line with a potential between ground and the voltage source. An output buffer circuit is connected between the first and third voltage supply lines, an inner gate circuit is connected between the third and second voltage supply lines, and input and output level converter circuits are connected, respectively, between an input terminal of the emitter-coupled logic circuit device and the inner gate circuit and between the inner gate circuit and the output buffer circuit, so that the current flowing from the first voltage supply line to the third voltage supply line through the output buffer circuit also flows from the third voltage supply line to the second voltage supply line through the inner gate circuit.

DESCRIPTION OF THE PREFERRED EMBODIMENT

An ECL circuit device according to the present invention will now be described in detail with reference to the accompanying drawings.

Figure 2:
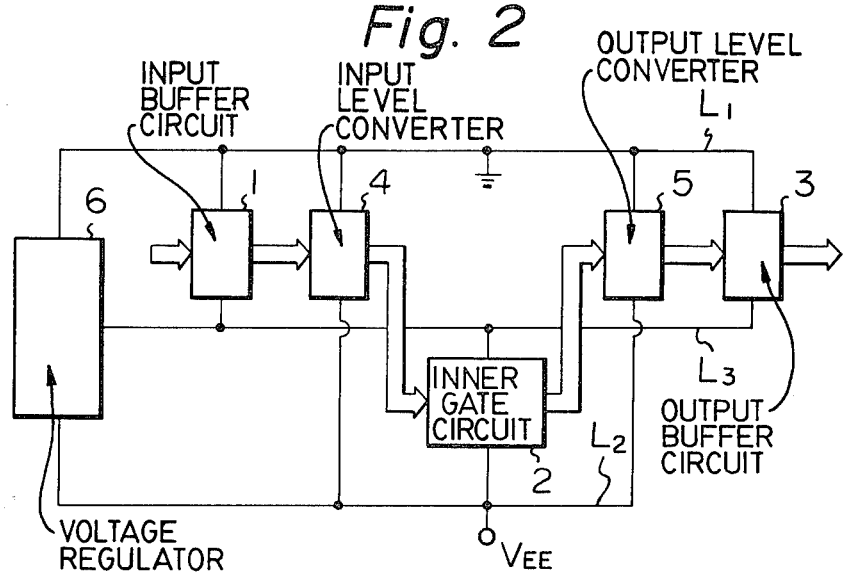
FIG. 2 is a schematic circuit diagram of an ECL circuit device in accordance with one embodiment of the present invention.

A schematic circuit diagram of an ECL circuit device according to the present invention is illustrated in FIG. 2. The ECL circuit device of FIG. 2 comprises a first voltage supply line L1 connected to the external ground line, a second voltage supply line L2 connected to the external voltage source $V_{EE}$, a third voltage supply line L3 having a constant voltage $V_M$ between ground and the voltage source $V_{EE}$, an input buffer circuit 1 supplied with the voltage between the first and the third voltage supply lines L1 and L3, an inner logic gate circuit 2 supplied with the voltage between the third and the second voltage supply lines L3 and L2, an output buffer circuit 3 supplied with the voltage between the first and the third voltage supply lines L1 and L3, an input level converter circuit 4 and an output level converter circuit 5 both supplied with the voltage between first and the second voltage supply lines (alternatively the voltage can be supplied by the first and third voltage supply lines L1 and L3.) and a voltage regulator 6 supplied with the voltage between the first and second voltage supply lines L1 and L2, the output terminal of the voltage regulator 6 being connected to the third voltage supply line L3.

In the ECL circuit device of FIG. 2, the input signals from the external circuits are inputted to the input buffer circuit 1, the output signals of the input buffer circuit 1 are inputted to the input level converter circuit 4 wherein level conversion is executed. The output signals of the level converter circuit 4 are inputted to the inner logic gate circuit 2 wherein logic signal processing is executed. The output signals of the inner logic gate circuit 2 are inputted to the level converter circuit 5, and the output signals of the level converter circuit 5 are inputted to the output buffer circuit 3.

The potential of the voltage source $V_{EE}$ may be $-5.2$ V to match with a standard ECL IC device. The "H" level of the input and output signals of the ECL of FIG. 2 is typically $-0.85$ V. The "L" level is typically $-1.75$ V. The output voltage of the voltage regulator 6, that is, the potential $V_M$ of the third voltage supply line L3 may be $-3.0$ V. Thus, the inner logic gate circuit 2 may be operated in the voltage range between $-3$ V and $-5.2$ V. The "H" level of the input and the output of the inner logical gate circuit may be about $-3.0$ V, and the "L" level may be typically $-3.4$ V.

Figure 3:
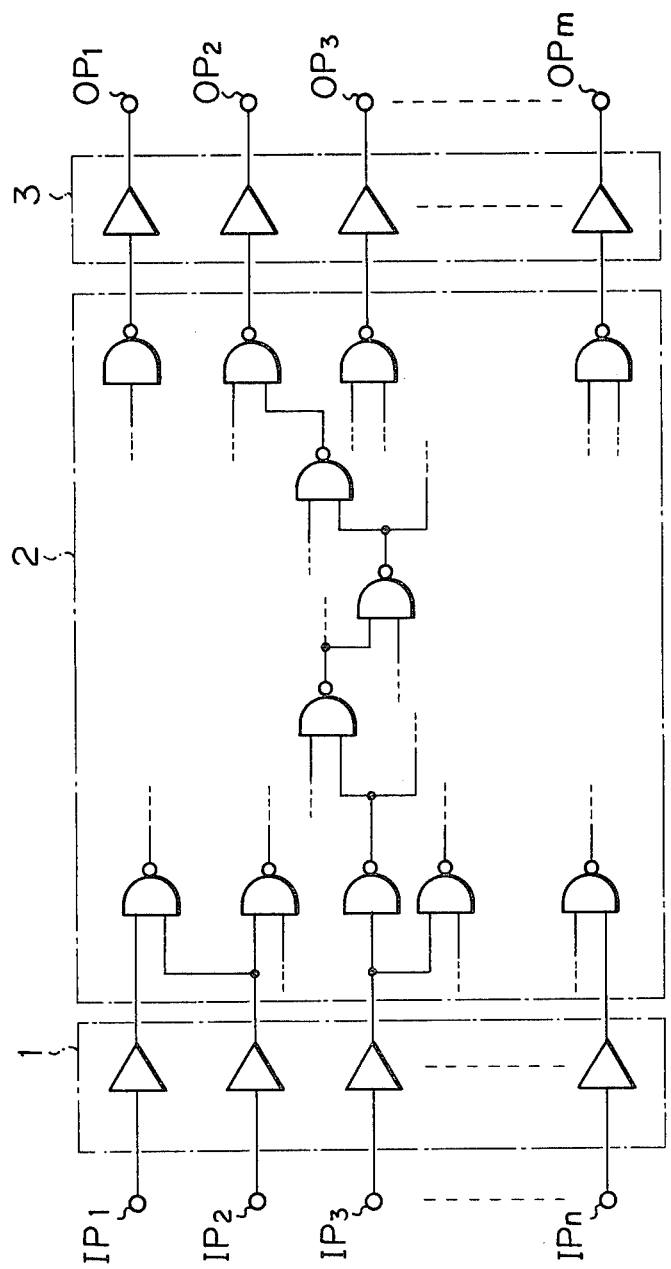
FIG. 3 is a schematic logic circuit diagram of the ECL circuit device of FIG. 2.

The logic circuit diagram of the ECL circuit device of FIG. 2 is illustrated in FIG. 3. In FIG. 3, the input and the output level converter circuits 4 and 5 of FIG. 2 are not shown directly because their logic functions may be included in those of the input and the output buffer circuits 1 and 3. As shown in FIG. 3, the ECL circuit device according to the present invention has a plurality of input terminals (pins) IP 1, IP 2 ... IP n and a plurality of output terminals (pins) OP 1, OP 2 ... OP m. The logic input signals fed to the ECL are inputted to the inner logic gate circuit 2 through the input buffer circuit 1. The inner logic gate circuit 2 comprises a plurality of logic elements such as NAND gates, which elements are mutually coupled so that the required logical function can be obtained. Thus, the signal processing required for the input signals is executed by the inner gate circuit 2, and the output signals obtained by the circuit 2 are fed to the output terminals through the output buffer circuit 3.

Figure 5:
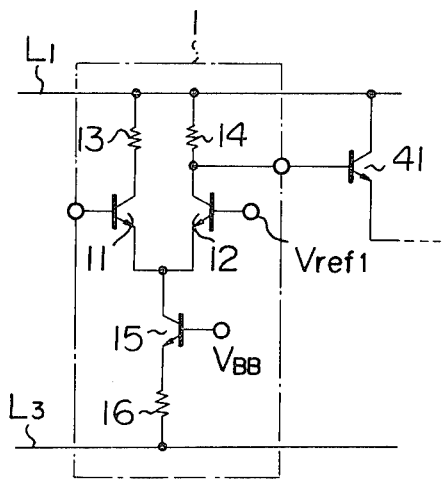
FIG. 5 is a detailed circuit diagram of the input buffer circuit of FIG. 2
Figure 4:
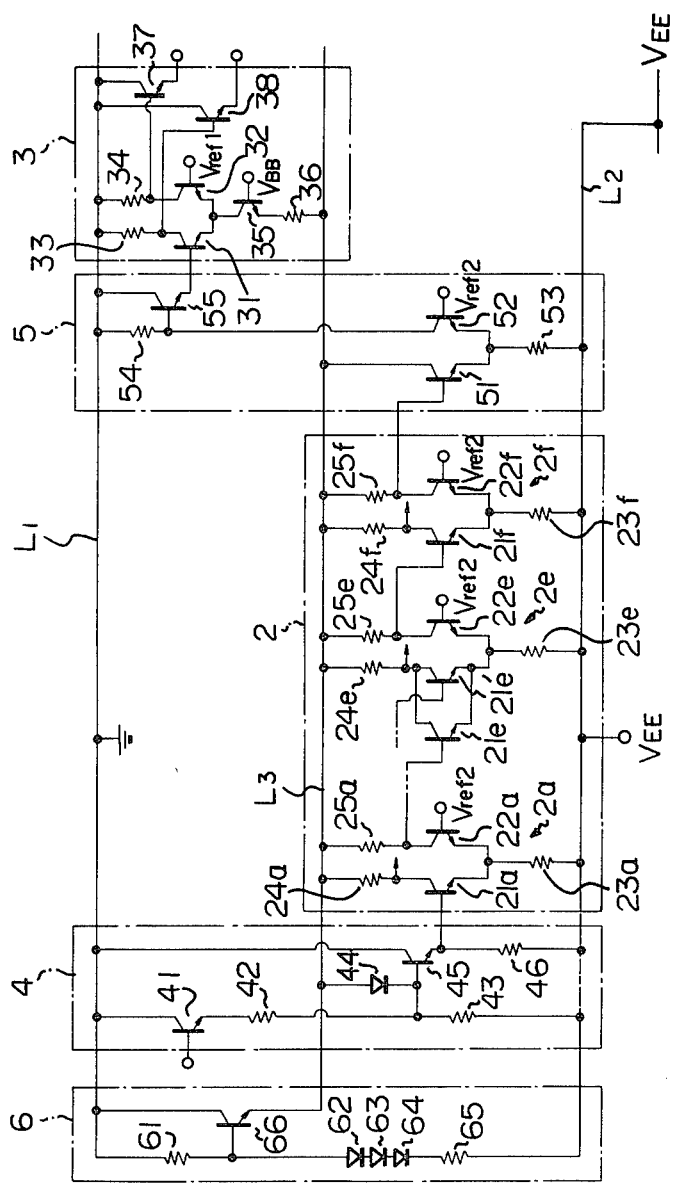
FIG. 4 is a detailed circuit diagram of the ECL circuit device of FIG. 2, except the input buffer circuit thereof.

A detailed circuit diagram of the ECL circuit device of FIG. 2 is illustrated in FIG. 4. The input buffer circuit 1 shown in FIG. 2 is not shown in FIG. 4 because the input signals may be fed directly to the level converter circuit 4. If input buffer circuit 1 is used, it may have the construction illustrated in FIG. 5. As shown in FIG. 5, the input buffer circuit 1 may have the same construction as the output buffer circuit 3 of FIG. 4. Though only one signal route is shown in FIG. 4, the ECL of FIG. 4 may have a plurality of signal routes, as shown in FIG. 3.

The input buffer circuit 1 has a pair of NPN transistors 11, 12, whose collectors are connected to the first voltage supply line L1 through resistors 13, 14, respectively, and whose emitters are commonly connected to the collector of an NPN transistor 15. The emitter of the transistor 15 is connected to the third voltage supply line L3 through a resistor 16 so that the transistor 15 and the resistor 16 form a current source. The base of the transistor 11 is connected to one of the input terminals, the base of the transistor 12 is connected to a first reference voltage $V_{ref1}$, and the collector of the transistor 12 is connected to one input of the level converter circuit 4.

The output buffer circuit 3 of FIG. 4 has the same construction as the input buffer circuit 1 of FIG. 5. As shown in FIG. 4, the output buffer circuit 3 comprises a pair of NPN transistors 31, 32, resistors 33, 34, an NPN transistor 35, a resistor 36, and output transistors 37, 38.

The input and the output buffer circuits 1 and 3 are operated in the voltage range between the ground level 0V and the constant voltage $V_M$ ($-3.0$ V) of the third voltage supply line L3. The inner gate circuit 2 is operated in the voltage range between the voltage $V_M$ ($-3.0$ V) and the voltage $V_{EE}$ ($-5.2$ V) of the second voltage supply line L2. Therefore, the level converter circuits 4 and 5 are inserted, respectively, between the input buffer circuit 1 and the inner gate circuit 2 and between the inner gate circuit 2 and the output buffer circuit 3.

The level converter circuit 4 has an input NPN transistor 41, resistors 42, 43, a diode 44, an output NPN transistor 45, and a resistor 46. The collector of the input transistor 41 is connected to the first voltage supply line L1, the base is connected to the input of the circuit 4, and the emitter is connected to the second voltage supply line L2 through the resistors 42 and 43 connected in series. The junction between the resistors 42 and 43 is connected to the base of the output transistor 45. It is also connected to the third voltage supply line L3 through the diode 44. That is, the anode of the diode 44 is connected to the base of the transistor 45, and the cathode of the diode 44 is connected to the third supply voltage line L3. The collector of the transistor 45 is connected to the first voltage supply line L1, and the emitter of the transistor 45 is connected to the second voltage supply line L2 through the resistor 46. The emitter of the transistor 45 is also connected to the input of the inner gate circuit 2.

On the other hand, the output level converter circuit 5 has a pair of NPN transistor 51, 52, resistors 53, 54, and an output NPN transistor 55. The base of the transistor 51 is connected to the output of the inner gate circuit 2, and the base of the transistor 52 is connected to the second reference voltage $V_{ref2}$. The emitters of the transistors 51 and 52 are both connected to the second voltage supply line L2 through the resistor 53. The collector of the transistor 51 is connected to the third voltage source line L3, and the collector of the transistor 52 is connected to the first voltage supply line L1 through the resistor 54. The collector of the transistor 52 is also connected to the base of the output transistor 55. The collector of the transistor 55 is connected to the first voltage supply line L1, and the emitter of the transistor 55 is connected to the input of the output buffer circuit 3.

The inner gate circuit 2 comprises a plurality of basic logic gates such as inverter gates and AND/NAND gates 2a, ... 2e, 2f. The basic logic gate 2a, which forms a complimentary output gate, comprises an input transistor 21a, a reference transistor 22a, and resistors 23a, 24a, 25a. The base of the transistor 21a is connected to receive the input signal, and the base of the transistor 22a is connected to the second reference voltage $V_{ref2}$. The emitters of the transistors 21a and 22a are commonly connected to the second voltage supply line L2 through the resistor 23a. The collector of the transistor 21a is connected to the third voltage supply line L3 through the resistor 24a, and the collector of the transistor 22a is connected to the third voltage supply line L3 through the resistor 25a. The inverting output signal of the gate 2a appears at the collector of the transistor 21a, and the noninverting output signal appears at the collector of the transistor 22a.

The basic logic gate 2e, which forms an AND/NAND gate (or an OR/NOR gate) with two inputs, comprises two input transistors 21e, 21e', a reference transistor 22e, and resistors 23e, 24e and 25e. The basic logic gate 2e has the same construction as the gate 2a except that it has two input transistors 21e, 21e' connected in parallel.

The voltage regulator 6 connected between the first and the second voltage supply lines L1, L2, comprises a resistor 61, diodes 62, 63, 64, a resistor 65, and a transistor 66. The resistor 61, the diodes 62, 63, 64, and the resistor 65 are connected between the first and the second voltage supply lines L1 and L2 in series, respectively. The junction between the resistor 61 and the diode 62 is connected to the base of the transistor 66. The collector of the transistor 66 is connected to the first voltage supply line L1, and the emitter of the transistor 66 is connected to the third voltage supply line L3. The output voltage of the voltage regulator 6, that is, the voltage of the third voltage supply line L3, is controlled to a constant voltage $V_M$. The current flowing between the collector and the emitter of the transistor 66 is controlled to compensate for the difference between the current flowing from the first voltage supply line L1 to the third voltage supply line L3 through the input and the output buffer circuits 1, 3 and the current flowing from the third voltage supply line L3 to the second voltage supply line L2 through the inner gate circuit 2.

In the ECL circuit device of FIG. 2, as described above, the current used to operate the input and the output buffer circuits 1 and 3 is also used to operate the inner gate circuit 2. The total current flowing from the first voltage supply line L1 to the second voltage supply line L2 is supplied from the external ground line and returns to the single external voltage source $V_{EE}$. The constant voltage $V_M$ of the third voltage supply line L3 is selected to be such a value that the differential voltage between the first and the third voltage supply lines L1 and L3 is enough to operate the input and the output buffer circuits 1 and 3 normally, and that the differential voltage between the third and second voltage supply lines L3 and L2 is enough to operate the inner gate circuit 2 normally.

In the output buffer circuit 2 of FIG. 4, the current necessary for each output is, for example, 5 mA which is relatively large because the inner impedance of the output buffer circuit cannot be made so high. If the ECL of FIG. 2 has 60 output terminals, the total current flowing through the output buffer circuit 3 from the voltage supply line L1 to L3 would become $5 \times 60 = 300$ mA. Since the inner impedance of the input buffer circuit 1 and the input and the output level converter circuits 4 and 5 can be made substantially high, the current flowing through these circuits 1, 4, and 5, may be made so small as to be negligible compared with the current flowing through the output buffer circuit 3.

If the inner gate circuit 2 of FIG. 5 has 5000 basic logic gates and the current required for each of the basic logic gates is 0.1 mA, then the total current required for the inner gate circuit 2 becomes 500 mA. Thus, there is a difference of 200 mA between the current required for the inner gate circuit 2 and the current supplied from the output buffer circuit 3. This 200 mA is supplied from the voltage regulator circuit 6, as described below. Accordingly, the voltage of the voltage supply line L3 can be kept at the desired constant value, and the inner gate circuit can be operated normally.

Figure 1:
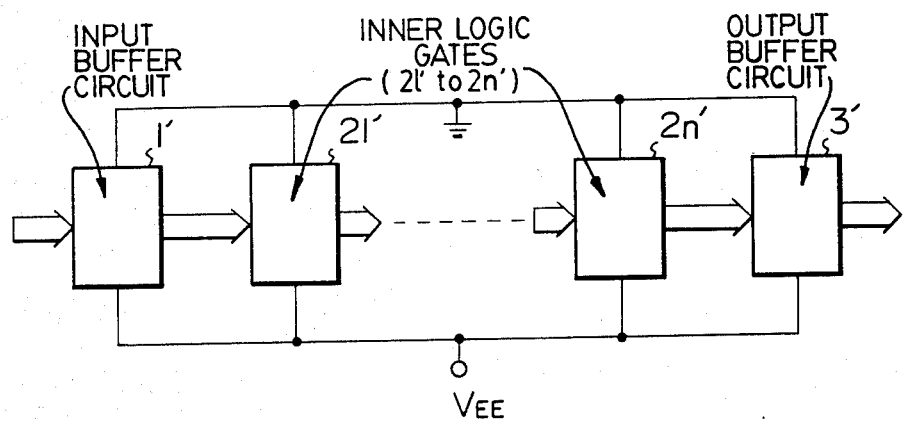
FIG. 1 is a schematic circuit diagram of a prior art ECL circuit device.

As described above, in the ECL circuit device of FIG. 2, the current flowing through the output buffer circuit 3 connected between the first and the third voltage lines L1 and L3 is caused to flow in sequence through the inner gate circuit 2 connected between the third and the second voltage supply lines L3 and L2. Therefore, the current supplied from the external voltage source $V_{EE}$ to the ECL circuit device of FIG. 2 can be decreased substantially. Thus, in the ECL circuit device according to the present invention, the power consumption of the circuit can be reduced significantly without decreasing the voltage supplied from the external voltage source. For example, assuming 60 output terminals and, 5000 basic logic gates, the power consumption of the ECL circuit device of FIG. 3 would be $500 \times mA \times 5.2 V = 2.6 W$ compared with $(500+300) mA \times 5.2 V = 4.16 W$ for the circuit of FIG. 1. Thus, the power consumption of the ECL can be reduced by about 40% with the present invention.

The above-mentioned characteristics of the ECL circuit device of FIG. 2 help suppress the temperature increase of each chip and provide advantages in the LSI operation and heat radiation.

Though in the above-mentioned embodiment of the present invention there has been described an ECL circuit device in which two kinds of operational voltages are used, the present invention can also be applied to an ECL circuit device in which three or more kinds of operational voltages are used.

I claim:

1. An emitter-coupled logic circuit device having an input terminal operatively connected to an external voltage source, comprising:
   first and second voltage supply lines connected, respectively, to ground and the external voltage source;
   a voltage regulator, operatively connected between said first and said second voltage supply lines, having an output terminal for providing a regulated potential between ground and the external voltage source;
   a third voltage supply line operatively connected to the output terminal of said voltage regulator;
   an output buffer circuit operatively connected between said first and said third voltage supply lines;
   an inner gate circuit operatively connected between said third and said second voltage supply lines; and
   input and output level converter circuits connected, respectively, between the input terminal of said emitter-coupled logic circuit device and said inner gate circuit and between said inner gate circuit and said output buffer circuit, the current flowing from said first voltage supply line to said third voltage supply line through said output buffer circuit also flowing from said third voltage supply line to said second voltage supply line through said inner gate circuit.

2. An emitter-coupled logic circuit device as claimed in claim 1, further comprising an input buffer circuit operatively connected between said first and said third voltage supply lines and operatively connected between the input terminal of said emitter-coupled logic circuit device and said input level converter circuit.

3. An emitter-coupled logic circuit device as claimed in claim 1 or 2, wherein said voltage regulator has a current path between said first and said third voltage supply lines and wherein the current flowing through said current path also flows through said inner gate circuit from said third voltage supply line to said second voltage supply line.

4. An emitter coupled logic circuit device operatively connected to receive an input signal and having an input terminal operatively connected to an external voltage source, comprising:
   a first voltage supply line operatively connect to ground;

a second voltage supply line operatively connected to the external voltage source;

a voltage regulator operatively connected between said first and said second voltage supply lines, having an output terminal for providing a regulated potential between ground and the external voltage source;

a third voltage supply line operatively connected to said output terminal of said voltage regulator;

an input level converter circuit, operatively connected between said first and said second voltage supply lines and operatively connected to receive the input signal, for providing a converted input signal;

an inner gate circuit, operatively connected between said third and said second voltage supply lines and operatively connected to said input level converter, for receiving the converted input signal and for logically processing the converted input signal to provide a processed output signal;

an output level converter, operatively connected between said first and said second voltage supply lines and operatively connected to said inner gate circuit, for receiving the processed signal and providing a converted output signal; and an output buffer circuit, operatively connected between said first and said third voltage supply lines and operatively connected to said output level converter, for receiving the converted output signal and outputting said converted output signal, a current flowing from said first voltage supply line to said third voltage supply line through said output buffer circuit, said current also flowing from said third voltage supply line to said second voltage supply line through said inner gate circuit.

5. An emitter-coupled logic circuit device as claimed in claim 4, further comprising an input buffer circuit, operatively connected between the input terminal of said emitter-coupled logic circuit device and said input level converter circuit and between said first and said third voltage supply lines and operatively connected to receive the input signal, for supplying the input signal to said input level converter circuit.

6. An emitter coupled logic circuit device as claimed in claim 4 or 5, wherein said current flowing from said third voltage supply line to said second voltage supply line through said inner gate circut also flows from said first voltage supply line through said third voltage supply line through said voltage regulator.

* * * * *